(12) United States Patent
Burton et al.

(10) Patent No.: US 10,937,868 B2
(45) Date of Patent: Mar. 2, 2021

(54) METHOD FOR MAKING SEMICONDUCTOR DEVICES WITH HYPER-ABRUPT JUNCTION REGION INCLUDING SPACED-APART SUPERLATTICES

(71) Applicant: ATOMERA INCORPORATED, Los Gatos, CA (US)

(72) Inventors: Richard Burton, Phoenix, AZ (US); Marek Hytha, Brookline, MA (US); Robert J. Mears, Wellesley, MA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 16/513,832

(22) Filed: Jul. 17, 2019

(65) Prior Publication Data

US 2021/0020750 A1    Jan. 21, 2021

(51) Int. Cl.
| | |
|---|---|
| *H01L 29/16* | (2006.01) |
| *H01L 29/15* | (2006.01) |
| *H01L 29/80* | (2006.01) |
| *H01L 29/66* | (2006.01) |
| *H01L 29/93* | (2006.01) |
| *H01L 29/78* | (2006.01) |

(52) U.S. Cl.
CPC ............ *H01L 29/152* (2013.01); *H01L 29/16* (2013.01); *H01L 29/66174* (2013.01); *H01L 29/66666* (2013.01); *H01L 29/66916* (2013.01); *H01L 29/7827* (2013.01); *H01L 29/802* (2013.01); *H01L 29/93* (2013.01)

(58) Field of Classification Search
CPC ............ H01L 29/152; H01L 29/66916; H01L 29/802; H01L 29/66666; H01L 29/16; H01L 29/66174; H01L 29/93; H01L 29/7827
See application file for complete search history.

(56) References Cited

U.S. PATENT DOCUMENTS

| | | |
|---|---|---|
| 4,937,204 A | 6/1990 | Ishibashi et al. |
| 5,216,262 A | 6/1993 | Tsu |

(Continued)

FOREIGN PATENT DOCUMENTS

| | | |
|---|---|---|
| GB | 2347520 | 6/2000 |

OTHER PUBLICATIONS

U.S. Appl. No. 15/916,766, filed Mar. 9, 2018 Weeks et al.
(Continued)

*Primary Examiner* — Matthew L Reames
(74) *Attorney, Agent, or Firm* — Allen, Dyer, Doppelt + Gilchrist, P.A.

(57) ABSTRACT

A method for making a semiconductor device may include forming a hyper-abrupt junction region above a substrate and including a first semiconductor layer having a first conductivity type, a first superlattice layer on the first semiconductor layer, a second semiconductor layer on the first superlattice layer and having a second conductivity type different than the first conductivity type, and a second superlattice layer on the second semiconductor layer. The method may further include forming a gate dielectric layer on the second superlattice layer of the hyper-abrupt junction region, forming a gate electrode on the gate dielectric layer, and forming spaced apart source and drain regions adjacent the hyper-abrupt junction region.

22 Claims, 13 Drawing Sheets

(56) References Cited

U.S. PATENT DOCUMENTS

| | | |
|---|---|---|
| 5,357,119 A | 10/1994 | Wang et al. |
| 5,683,934 A | 11/1997 | Candelaria |
| 5,796,119 A | 8/1998 | Seabaugh |
| 6,141,361 A | 10/2000 | Mears et al. |
| 6,376,337 B1 | 4/2002 | Wang et al. |
| 6,472,685 B2 | 10/2002 | Takagi |
| 6,741,624 B2 | 5/2004 | Mears et al. |
| 6,830,964 B1 | 12/2004 | Mears et al. |
| 6,833,294 B1 | 12/2004 | Mears et al. |
| 6,878,576 B1 | 4/2005 | Mears et al. |
| 6,891,188 B2 | 5/2005 | Mears et al. |
| 6,897,472 B2 | 5/2005 | Mears et al. |
| 6,927,413 B2 | 8/2005 | Mears et al. |
| 6,952,018 B2 | 10/2005 | Mears et al. |
| 6,958,486 B2 | 10/2005 | Mears et al. |
| 6,993,222 B2 | 1/2006 | Mears et al. |
| 7,018,900 B2 | 3/2006 | Kreps |
| 7,033,437 B2 | 4/2006 | Mears et al. |
| 7,034,329 B2 | 4/2006 | Mears et al. |
| 7,045,377 B2 | 5/2006 | Mears et al. |
| 7,045,813 B2 | 5/2006 | Mears et al. |
| 7,071,119 B2 | 7/2006 | Mears et al. |
| 7,105,895 B2 | 9/2006 | Wang et al. |
| 7,109,052 B2 | 9/2006 | Mears et al. |
| 7,123,792 B1 | 10/2006 | Mears et al. |
| 7,148,712 B1 | 12/2006 | Prey, Jr. et al. |
| 7,153,763 B2 | 12/2006 | Hytha et al. |
| 7,183,628 B2 | 2/2007 | Coolbaugh et al. |
| 7,202,494 B2 | 4/2007 | Blanchard et al. |
| 7,227,174 B2 | 6/2007 | Mears et al. |
| 7,229,902 B2 | 6/2007 | Mears et al. |
| 7,265,002 B2 | 9/2007 | Mears et al. |
| 7,279,699 B2 | 10/2007 | Mears et al. |
| 7,279,701 B2 | 10/2007 | Kreps |
| 7,288,457 B2 | 10/2007 | Kreps |
| 7,303,948 B2 | 12/2007 | Mears et al. |
| 7,432,524 B2 | 10/2008 | Mears et al. |
| 7,435,988 B2 | 10/2008 | Mears et al. |
| 7,436,026 B2 | 10/2008 | Kreps |
| 7,446,002 B2 | 11/2008 | Mears et al. |
| 7,446,334 B2 | 11/2008 | Mears et al. |
| 7,491,587 B2 | 2/2009 | Rao |
| 7,514,328 B2 | 4/2009 | Rao |
| 7,517,702 B2 | 4/2009 | Halilov et al. |
| 7,531,828 B2 | 5/2009 | Mears et al. |
| 7,531,829 B2 | 5/2009 | Blanchard |
| 7,531,850 B2 | 5/2009 | Blanchard |
| 7,586,116 B2 | 9/2009 | Kreps et al. |
| 7,586,165 B2 | 9/2009 | Blanchard |
| 7,598,515 B2 | 10/2009 | Mears et al. |
| 7,612,366 B2 | 11/2009 | Mears et al. |
| 7,625,767 B2 | 12/2009 | Huang et al. |
| 7,659,539 B2 | 2/2010 | Kreps et al. |
| 7,700,447 B2 | 4/2010 | Dukovski et al. |
| 7,718,996 B2 | 5/2010 | Dukovski et al. |
| 7,781,827 B2 | 8/2010 | Rao |
| 7,812,339 B2 | 10/2010 | Mears et al. |
| 7,825,441 B2 | 11/2010 | Eshun et al. |
| 7,863,066 B2 | 1/2011 | Mears et al. |
| 7,880,161 B2 | 2/2011 | Mears et al. |
| 7,928,425 B2 | 4/2011 | Rao |
| 8,168,500 B2 | 5/2012 | Campi et al. |
| 8,389,974 B2 | 3/2013 | Mears et al. |
| 9,275,996 B2 | 3/2016 | Mears et al. |
| 9,406,753 B2 | 8/2016 | Mears et al. |
| 9,558,939 B1 | 1/2017 | Stephenson et al. |
| 9,899,479 B2 | 2/2018 | Mears et al. |
| 9,941,359 B2 | 4/2018 | Mears et al. |
| 10,084,045 B2 | 9/2018 | Mears et al. |
| 10,107,854 B2 | 10/2018 | Roy |
| 10,109,342 B2 | 10/2018 | Roy |
| 10,109,479 B1 | 10/2018 | Mears et al. |
| 10,170,560 B2 | 1/2019 | Mears |
| 10,170,603 B2 | 1/2019 | Mears et al. |
| 10,170,604 B2 | 1/2019 | Mears et al. |
| 10,191,105 B2 | 1/2019 | Roy |
| 10,249,745 B2 | 4/2019 | Mears et al. |
| 10,276,625 B1 | 4/2019 | Mears et al. |
| 10,304,881 B1 | 5/2019 | Chen et al. |
| 2003/0034529 A1 | 2/2003 | Fitzgerald et al. |
| 2003/0057416 A1 | 3/2003 | Currie et al. |
| 2006/0145300 A1 | 7/2006 | Coolbaugh et al. |
| 2006/0220118 A1 | 10/2006 | Stephenson et al. |
| 2006/0267130 A1 | 11/2006 | Rao |
| 2007/0012910 A1 | 1/2007 | Mears et al. |
| 2007/0020833 A1 | 1/2007 | Mears et al. |
| 2007/0278565 A1 | 12/2007 | Tu et al. |
| 2008/0012004 A1 | 1/2008 | Huang et al. |
| 2008/0258134 A1 | 10/2008 | Mears et al. |
| 2008/0315266 A1 | 12/2008 | Eshun et al. |
| 2009/0250739 A1 | 10/2009 | Johnson et al. |
| 2010/0059859 A1 | 3/2010 | Trivedi |
| 2011/0215299 A1 | 9/2011 | Rao |
| 2015/0357414 A1 | 12/2015 | Mears |
| 2016/0099317 A1* | 4/2016 | Mears ............ H01L 29/165 257/19 |
| 2016/0149023 A1 | 5/2016 | Mears et al. |
| 2016/0358773 A1 | 12/2016 | Mears et al. |
| 2018/0040724 A1 | 2/2018 | Mears et al. |
| 2018/0337063 A1 | 11/2018 | Takeuchi |
| 2018/0337064 A1 | 11/2018 | Takeuchi |
| 2018/0358361 A1 | 12/2018 | Rao |
| 2018/0358442 A1 | 12/2018 | Rao |
| 2019/0057896 A1 | 2/2019 | Stephenson et al. |
| 2019/0058059 A1 | 2/2019 | Stephenson et al. |
| 2019/0189652 A1 | 6/2019 | Chen et al. |
| 2019/0189655 A1 | 6/2019 | Chen et al. |
| 2019/0189657 A1 | 6/2019 | Chen et al. |
| 2019/0189658 A1 | 6/2019 | Chen et al. |
| 2019/0189665 A1 | 6/2019 | Chen et al. |
| 2019/0189669 A1 | 6/2019 | Chen et al. |
| 2019/0189670 A1 | 6/2019 | Chen et al. |
| 2019/0189676 A1 | 6/2019 | Chen et al. |
| 2019/0189677 A1 | 6/2019 | Mears et al. |
| 2019/0189817 A1 | 6/2019 | Chen et al. |
| 2019/0189818 A1 | 6/2019 | Chen et al. |

OTHER PUBLICATIONS

U.S. Appl. No. 15/916,831, filed Mar. 9, 2018 Weeks et al.
U.S. Appl. No. 16/117,178, filed Aug. 30, 2018 Weeks et al.
U.S. Appl. No. 16/117,202, filed Aug. 30, 2018 Weeks et al.
U.S. Appl. No. 16/176,005, filed Oct. 31, 2018 Weeks et al.
U.S. Appl. No. 16/192,897, filed Nov. 16, 2018 Connelly et al.
U.S. Appl. No. 16/192,911, filed Nov. 16, 2018 Takeuchi et al.
U.S. Appl. No. 16/192,923, filed Nov. 16, 2018 Takeuchi et al.
U.S. Appl. No. 16/192,930, filed Nov. 16, 2018 Takeuchi et al.
U.S. Appl. No. 16/192,941, filed Nov. 16, 2018 Takeuchi et al.
U.S. Appl. No. 16/192,959, filed Nov. 16, 2018 Takeuchi et al.
U.S. Appl. No. 16/192,987, filed Nov. 16, 2018 Takeuchi et al.
U.S. Appl. No. 16/193,000, filed Nov. 16, 2018 Takeuchi et al.
U.S. Appl. No. 16/193,011, filed Nov. 16, 2018 Takeuchi et al.
U.S. Appl. No. 16/296,400, filed Mar. 8, 2019 Stephenson et al.
U.S. Appl. No. 16/296,414, filed Mar. 8, 2019 Stephenson et al.
U.S. Appl. No. 16/380,091, filed Apr. 10, 2019 Robert Stephenson.
U.S. Appl. No. 16/380,111, filed Apr. 10, 2019 Robert Stephenson.
U.S. Appl. No. 16/380,142, filed Apr. 10, 2019 Robert Stephenson.
U.S. Appl. No. 16/380,149, filed Apr. 10, 2019 Robert Stephenson.
U.S. Appl. No. 16/513,528, filed 17/17/2019; Burton et al.
Xu et al "Electron mobility enhancement in (100) oxygen-inserted silicon channel" Appl. Phys. Lett. 107, 123502 (2015); Abstract Only.
U.S. Appl. No. 16/513,845, filed 17/17/2019 Burton et al.
U.S. Appl. No. 16/513,875, filed 17/17/2019 Burton et al.
U.S. Appl. No. 16/513,895, filed 17/17/2019 Burton et al.
U.S. Appl. No. 16/513,906, filed 17/17/2019 Burton et al.
U.S. Appl. No. 16/513,932, filed 17/17/2019 Burton et al.
U.S. Appl. No. 16/513,943, filed 17/17/2019 Burton et al.
Luo et al., "Chemical Design of Direct-Gap Light-Emitting Silicon" published in Physical Review Letters, vol. 89, No. 7; Aug. 12, 2002; 4 pgs.

(56) References Cited

OTHER PUBLICATIONS

Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.

Novikov et al. "Silicon-based Optoelectronics" 1999-2003, pp. 1-6.

R. Tsu Phenomena in silicon nanostructure device published online Sep. 6, 2000 by Applied Physics and Materials Science & Processing, pp. 391-402.

R. Tsu "Si Based Green ELD: Si-Oxygen Superiattice" wysiwyg://l/http://www3.interscience.wiley.com/cgi-bin/abstract/72512946/ start: published online Jul. 21, 2000; 2 pgs. Abstract Only.

Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net: retrieved from Internet Jan. 18, 2016.

Xu et al. "Extension of planar bulk n-channel MOSFET scaling with oxygen insertion technology" IEEE Transactions on Electron devices, vol. 61, No. 9; Sep. 2014. pp. 3345-3349.

Xu et al., "MOSFET performance and scalability enhancement by insertion of oxygen layers", Department of Electrical Engineering and Computer Science, University of California, Berkeley, 2012, pp. 1-4.

Skyworks Datasheet "SMV2025 Series: Surface Mount, Silicon Hyperabrupt Tuning Varactor Diodes" Aug. 7, 2015; http://www.skyworksinc.com/uploads/documents/SMV2025_Series_201431E.pdf pp. 7.

Microsemi "SOT23 Hyperabrupt Series" https://www.microsemi.com/product-directory/varactors-surface-mount/3202-sot23-hyperabrupt-series; Retrieved from internet Dec. 19, 2018, pp. 2.

\* cited by examiner

METHOD FOR MAKING SEMICONDUCTOR DEVICES WITH HYPER-ABRUPT JUNCTION REGION INCLUDING SPACED-APART SUPERLATTICES

TECHNICAL FIELD

The present disclosure generally relates to semiconductor devices and, more particularly, to semiconductor devices including hyper-abrupt junctions and related methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

U.S. Pat. No. 7,105,895 to Wang et al. discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A method for making a semiconductor device may include forming a hyper-abrupt junction region above a substrate and comprising a first semiconductor layer having a first conductivity type, a first superlattice layer on the first semiconductor layer, a second semiconductor layer on the first superlattice layer and having a second conductivity type different than the first conductivity type, and a second superlattice layer on the second semiconductor layer. The method may further include forming a gate dielectric layer on the second superlattice layer of the hyper-abrupt junction region, forming a gate electrode on the gate dielectric layer, and forming spaced apart source and drain regions adjacent the hyper-abrupt junction region. The first and second superlattices may each include a plurality of stacked groups of layers, with each group of layers including a plurality of stacked base semiconductor monolayers defining a base semiconductor portion, and at least one non-semiconductor monolayer constrained within a crystal lattice of adjacent base semiconductor portions.

More particularly, the spaced apart source and drain regions may have the second conductivity type. In one example implementation, the first and second semiconductor layers and the first and second superlattice layers may be parallel to underlying portions of the substrate. In accordance with another example implementation, the first and second semiconductor layers and the first and second superlattice layers may be U-shaped.

By way of example, the first and second semiconductor layers may each have a thickness in a range of 50 nm to 300 nm. Also by way of example, the base semiconductor monolayers may comprise at least one of silicon and germanium, and the at least one non-semiconductor monolayer may comprise at least one of oxygen, nitrogen, fluorine, carbon and carbon-oxygen.

DETAILED DESCRIPTION

Figure 1:
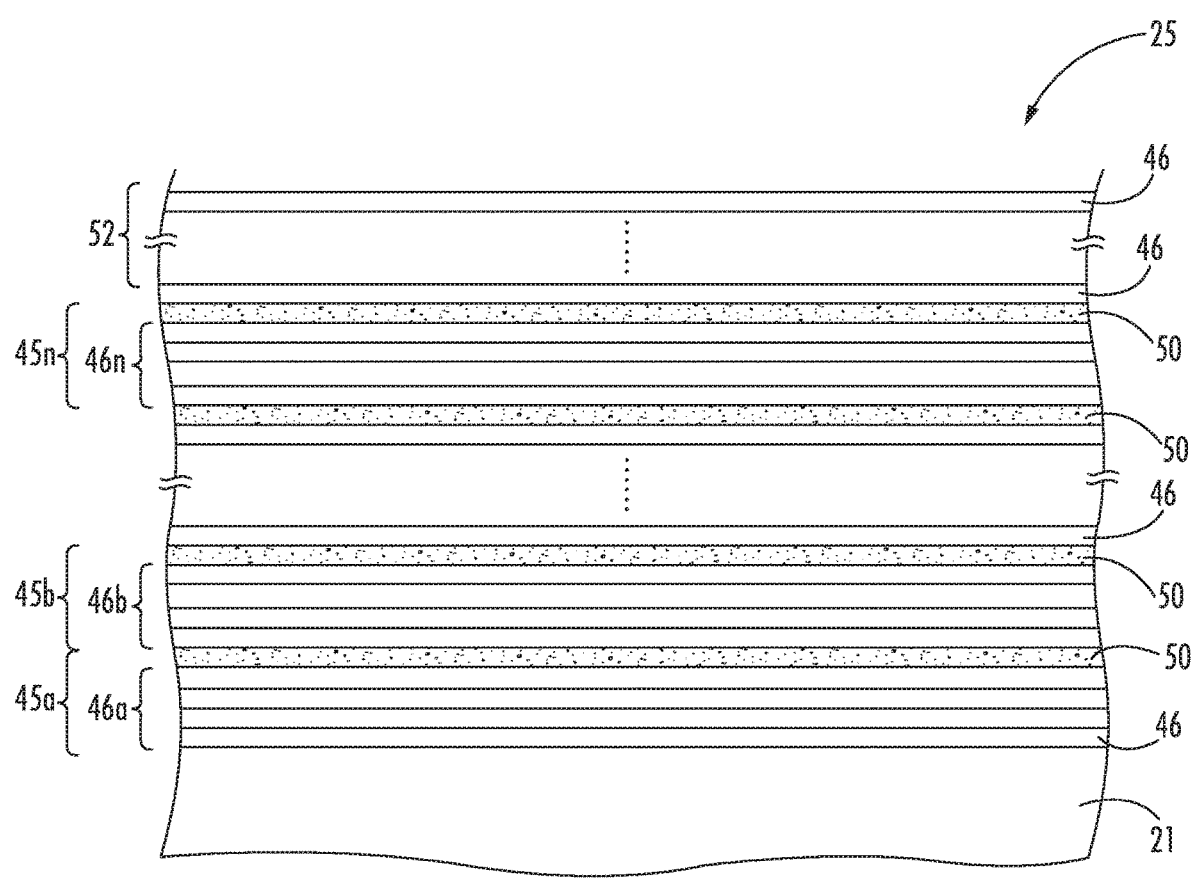
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime and multiple prime notation are used to indicate similar elements in different embodiments.

Generally speaking, the present disclosure relates to devices having an enhanced semiconductor superlattice therein. The enhanced semiconductor superlattice is also referred to as an "MST" layer or "MST technology" in this disclosure and the accompanying drawings.

More particularly, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) =$$

$$\frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
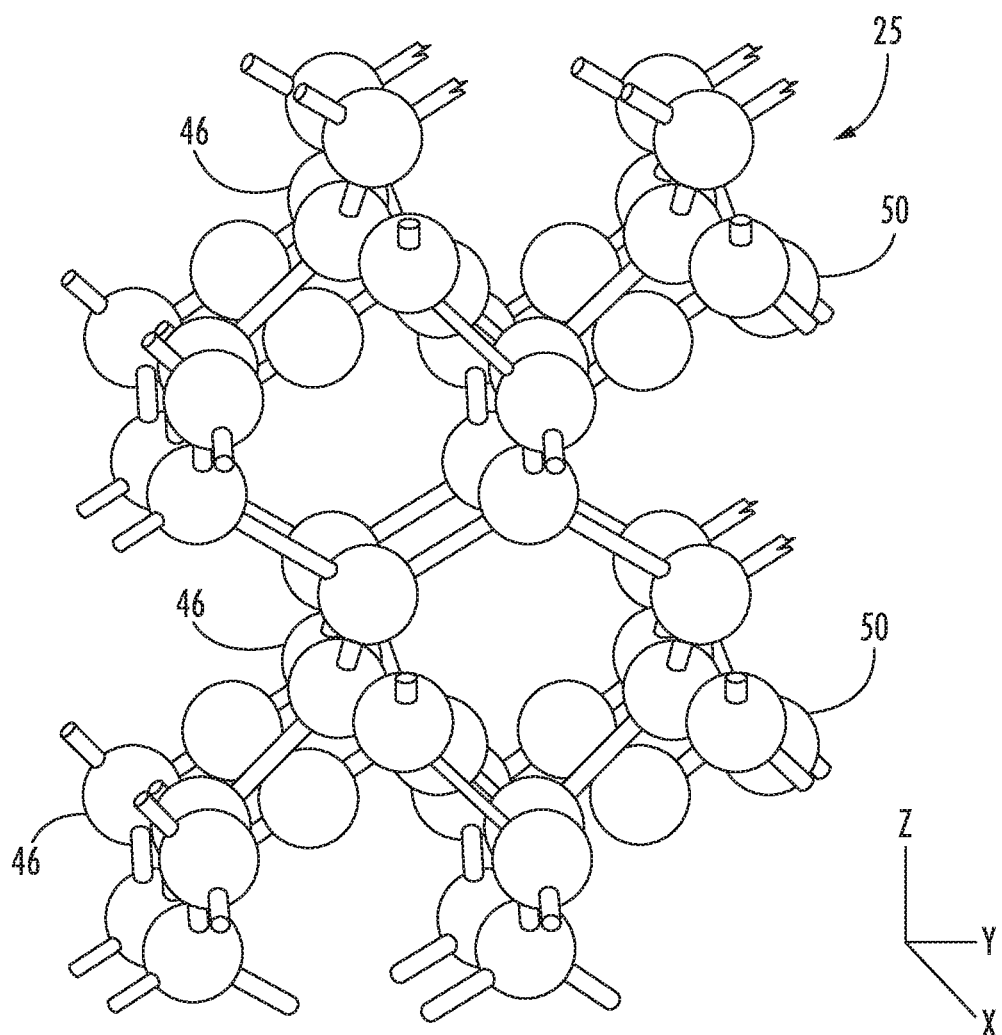
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example.

It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
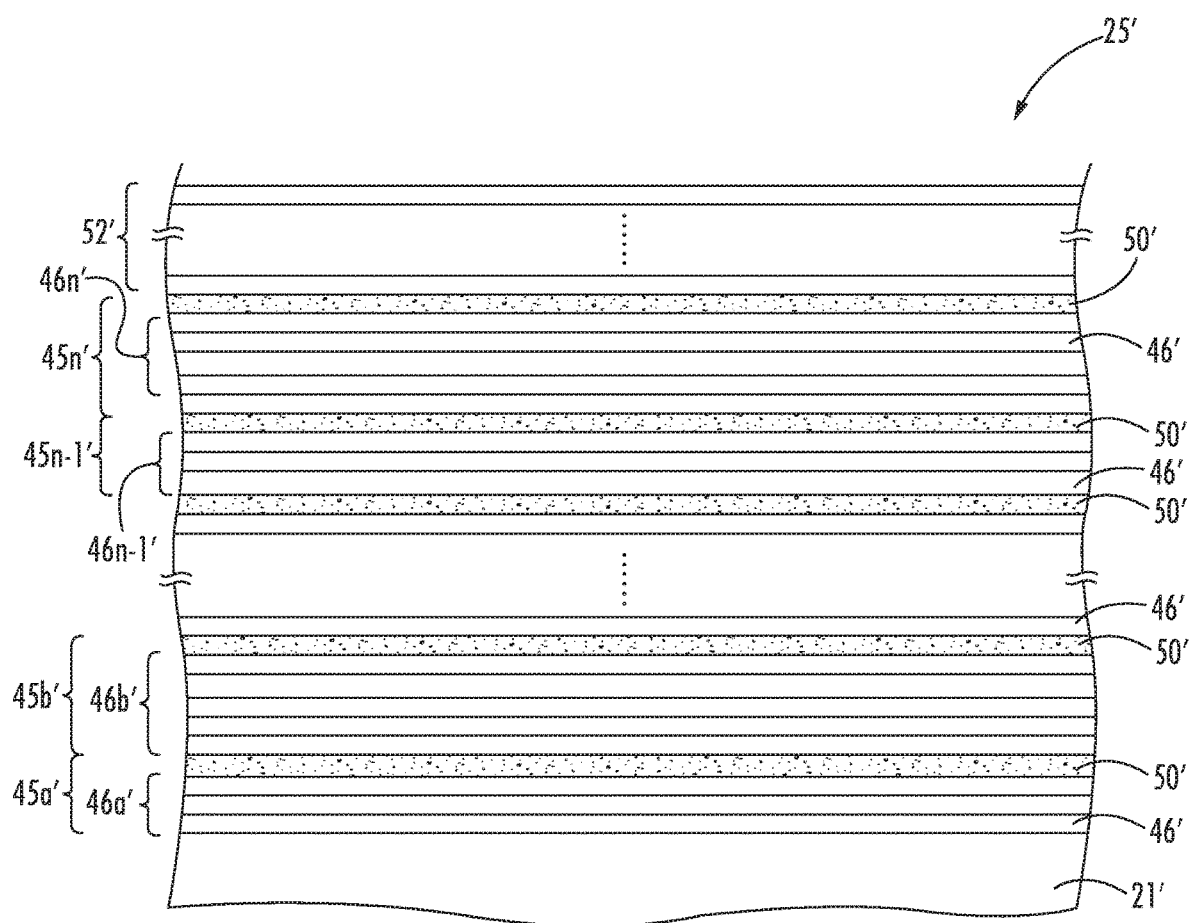
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
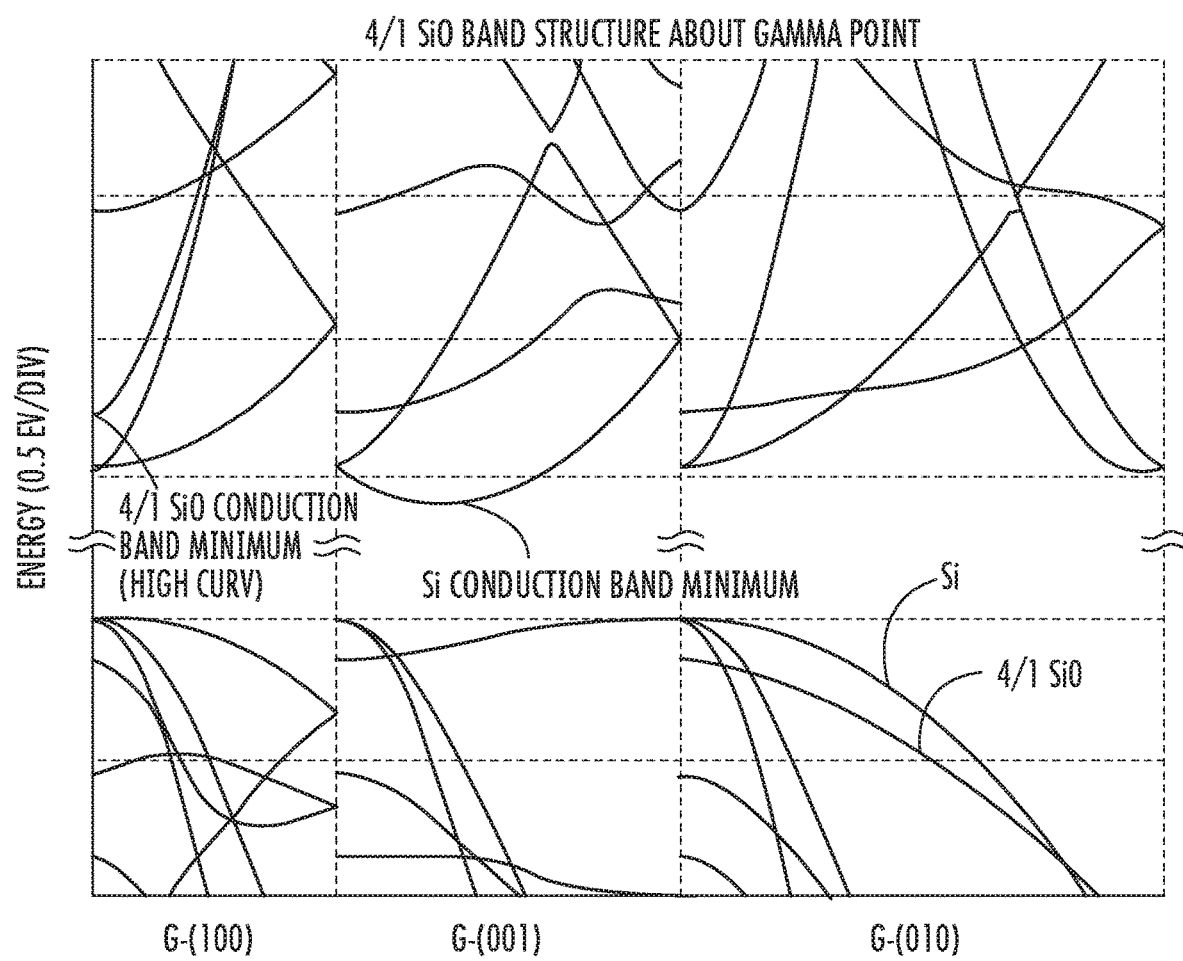
FIG. 4A is a graph of the calculated band structure from the gamma point (G) for both bulk silicon as in the prior art, and for the 4/1 Si/O superlattice as shown in FIGS. 1-2.
Figure 4B:
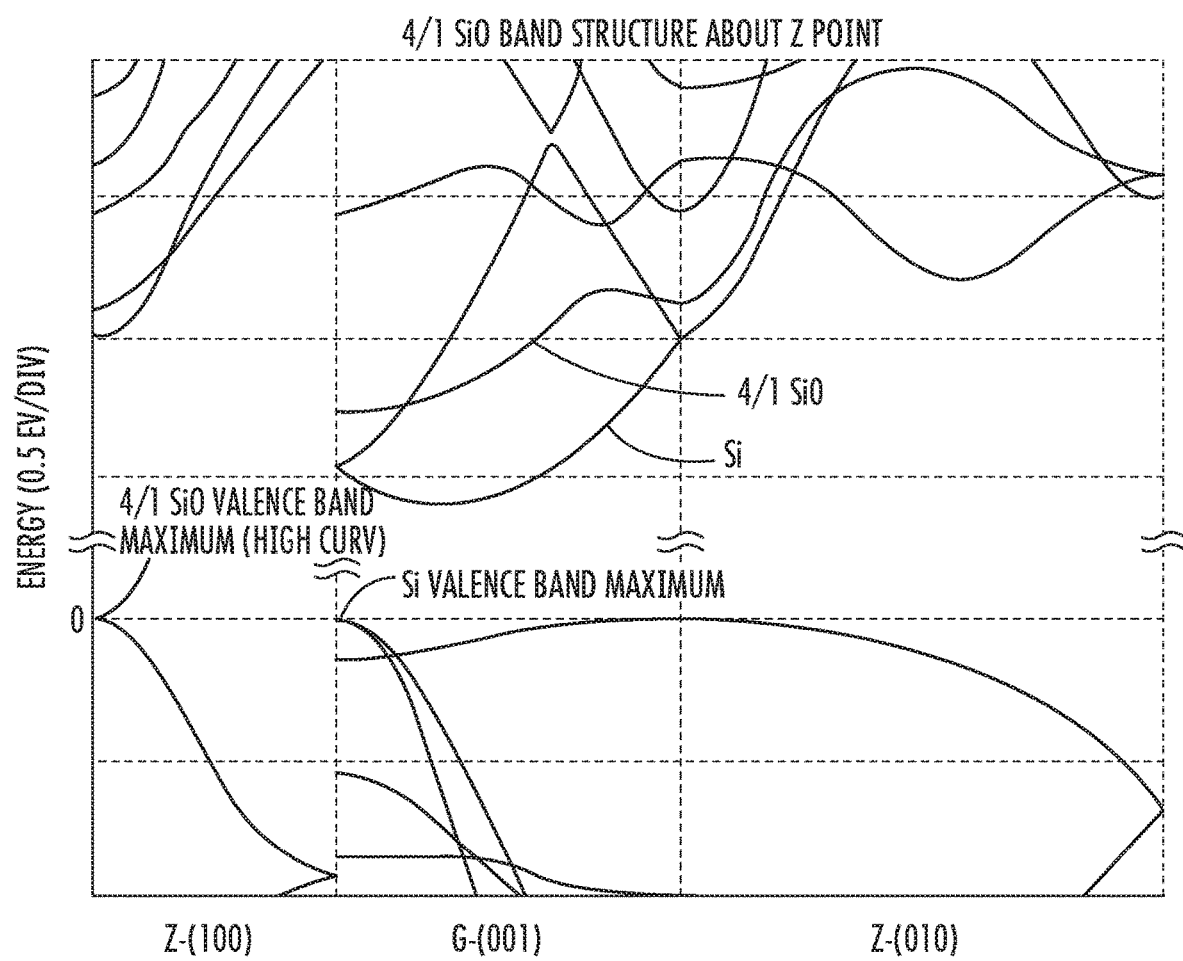
FIG. 4B is a graph of the calculated band structure from the Z point for both bulk silicon as in the prior art, and for the 4/1 Si/O superlattice as shown in FIGS. 1-2.
Figure 4C:
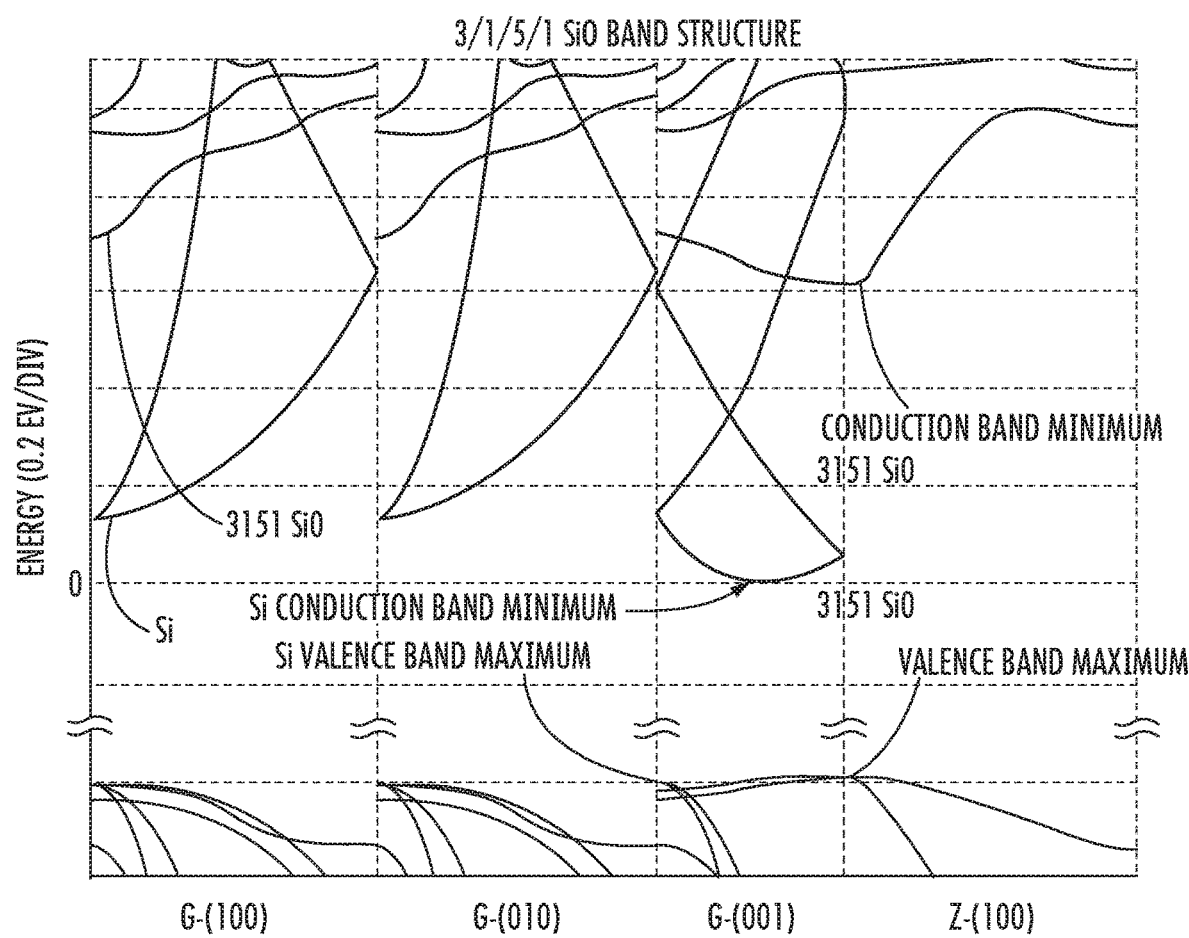
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (OFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
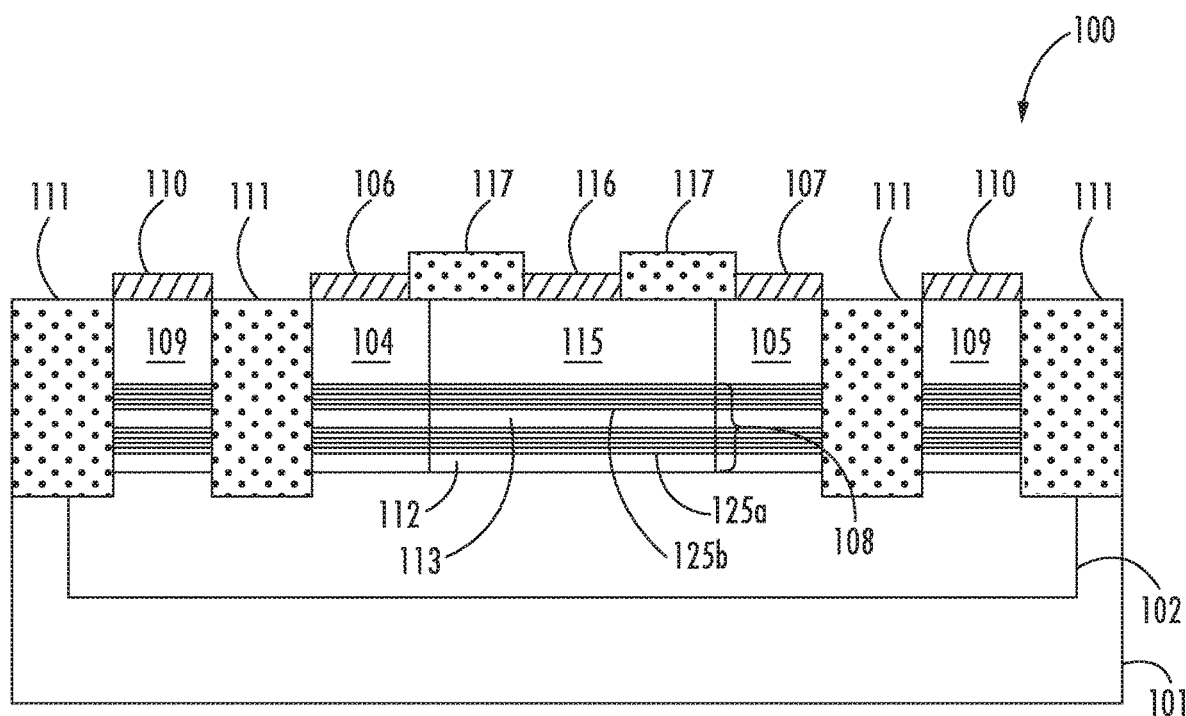
FIG. 5 is a schematic cross-sectional diagram of a JFET including a hyper-abrupt junction incorporating superlattices in accordance with an example embodiment.

Referring now to FIG. 5, the above described superlattice structures may advantageously be used to provide hyper-abrupt junctions in a variety of different semiconductor devices. In a typical hyper-abrupt or super-junction device, thin (e.g., 50 nm-300 nm) P and N layers are grown adjacent to one another to form a super-junction channel. However, a problem with this configuration is that adjacent thin P and N layers will tend to compensate one another through diffusion, and will limit the mobility and amount of charge which may be effectively incorporated into the layers without degradation.

In the example embodiments presented herein, one or more diffusion blocking superlattice layers, such as the MST superlattice layers discussed above, are advantageously incorporated into a hyper-abrupt junction stack. The superlattice layers advantageously block inter-diffusion, and accordingly increase the available charge with higher mobility due to less ionized impurity scattering. In accordance with a first example, a JFET 100 illustratively includes a semiconductor substrate 101 with a back gate 102 therein. Spaced-apart source and drain regions 104, 105 with respective contacts 106, 107 are formed on the back gate 102, and a hyper-abrupt junction region 108 is also formed on the back gate between the source and drain regions. Furthermore, back gate reach through regions 109 with contacts 110 are coupled to the back gate 102, and isolation regions 111 (e.g., an oxide) separate the back gate reach through regions from the source drain regions 104, 105. It should be noted that, in some embodiments, the back gate reach through regions 109 could instead extend from a back side of the substrate 101 rather than from the top/front side as shown, in which case the contact(s) 110 would be on the back side of the substrate.

More particularly, the hyper-abrupt junction region 108 illustratively includes a first semiconductor layer 112 having a first conductivity type (N or P), a first superlattice layer 125a on the first semiconductor layer, a second semiconductor layer 113 on the first superlattice layer and having a second conductivity type different than the first conductivity type (P or N), and a second superlattice layer 125b on the second semiconductor layer. Furthermore, a gate overlies the second superlattice layer 125b and illustratively includes a gate electrode 115, which will typically be the same conductivity type as the back gate 102 and the first semiconductor layer 112 (i.e., the first conductivity type), while the semiconductor layer 113 and source/drain regions 104, 105 will be the same conductivity type (here the second conductivity type). The second semiconductor layer 113 of the hyper-abrupt junction region 108 defines a hyper-abrupt channel of the JFET 100. The superlattice layers 125a, 125b effectively block inter-diffusion and thus increase the available charge with higher mobility within the channel due to less ionized impurity scattering.

Figure 10:
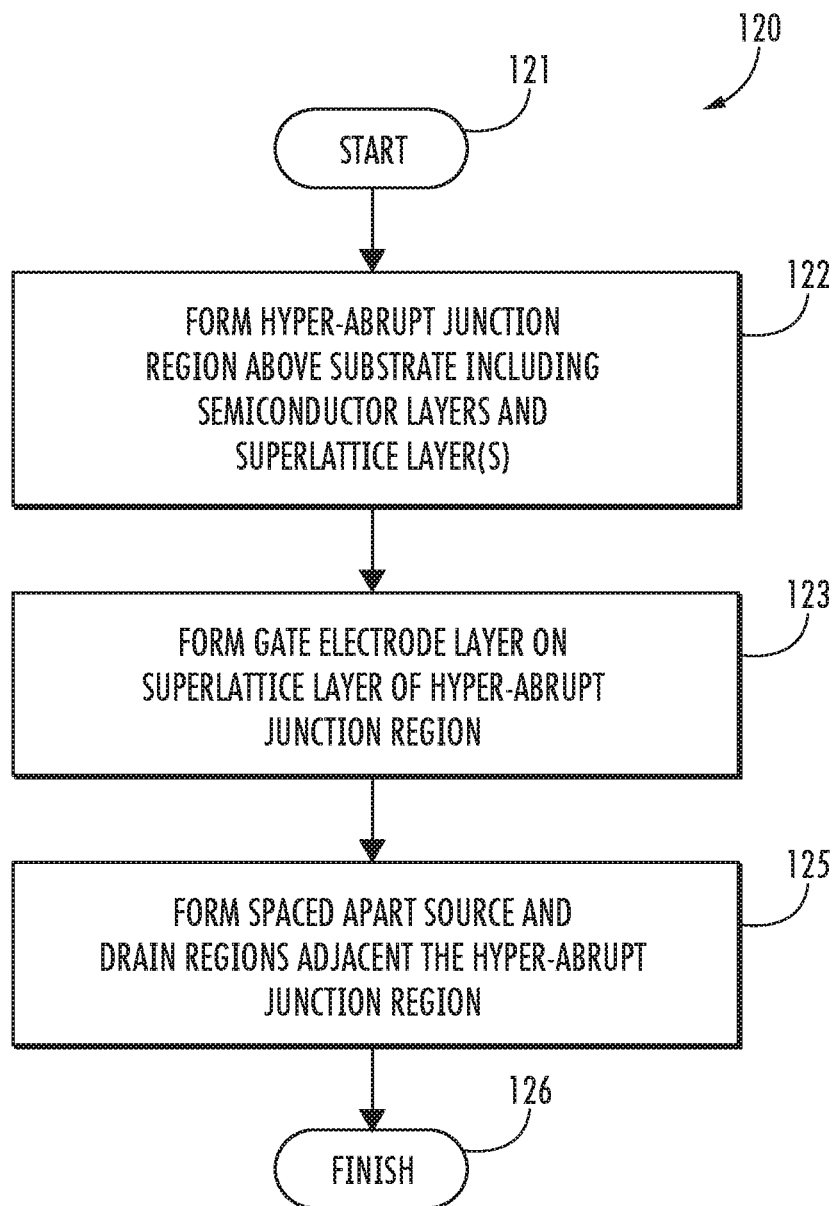
FIG. 10 is a flow diagram illustrating method aspects associated with fabrication of the devices of FIGS. 5-7.

Referring additionally to the flow diagram 120 of FIG. 10, beginning at Block 121, the semiconductor layers 112, 113 and superlattices 125a, 125b may be formed in an alternating fashion as blanket layers across the substrate 101, or selectively at the desired locations on the substrate to form the hyper-abrupt junction region 108, at Block 122. In the illustrated example, the superlattices 125a, 125b extend into the source and drain regions 104, 105, and into the back gate reach through regions 109, although the superlattices may be constrained within the channel region only in some embodiments, if desired. The gate electrode layer 115 may then be formed over the superlattice 125b, at Block 123, followed by a gate contact 116. The source and drain regions 106, 107 may be formed by doping with the appropriate conductivity type dopant (P-type for a P channel and vice-versa), at Block 125, and the back gate reach through regions 109 may be similarly formed. Isolation regions 117 are also formed to separate the source and drain contacts 106, 107 from the gate contact. The method of FIG. 10 illustratively concludes at Block 126.

Figure 6:
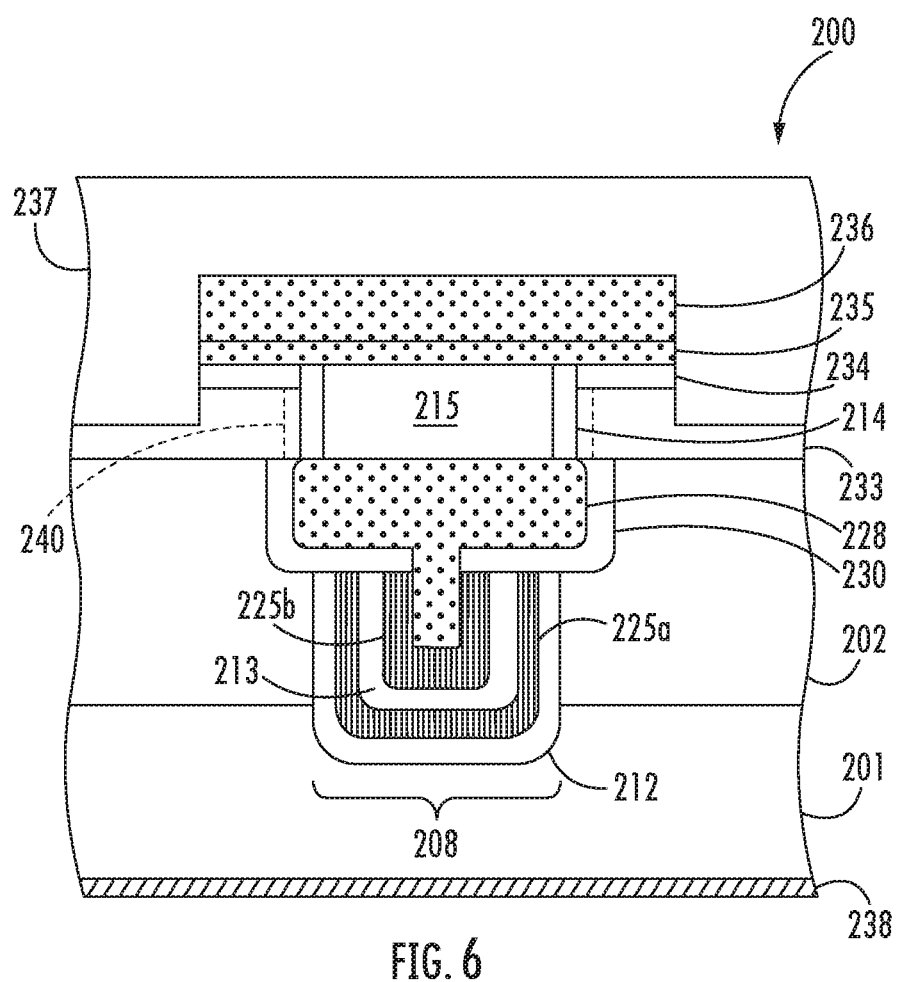
FIG. 6 is a schematic cross-sectional diagram of an IGFET including a hyper-abrupt junction incorporating superlattices in accordance with an example embodiment.

Turning to FIG. 6, the above-described techniques may also be used for making other FET structures, such as an IGFET 200. The IGFET 200 illustratively includes a substrate 201 and a semiconductor layer 202 on the substrate. A hyper-abrupt junction region 208 is positioned within the semiconductor layer 202 and extends partially into the substrate 201. The hyper-abrupt junction region 208 illustratively includes a first semiconductor layer 212 having a first conductivity type (N or P), a first superlattice layer 225a on the first semiconductor layer, a second semiconductor layer 213 on the first superlattice layer and having a second conductivity type different than the first conductivity type (P or N), and a second superlattice layer 225b on the second semiconductor layer. Moreover, the hyper-abrupt junction region 208 is U-shaped and may be formed as a filled trench structure by depositing the above-noted layers successively within a trench extending through the semiconductor layer 202 into the substrate 201.

Overlying the hyper-abrupt junction region 208 are drain extension regions 230 and a dielectric layer 228. Furthermore, a gate electrode layer 215 overlies the dielectric layer 228 and is surrounded by a gate dielectric layer 214. A body region 233 surrounds the gate dielectric layer and defines a conduction channel 240 adjacent the gate dielectric layer 232. Overlying the body region 233 is a source region 234, and overlying the source region and gate are first and second dielectric layers 235, 236. Furthermore, a source contact layer 237 (e.g., semiconductor) may be formed over the top side of the device 200 (i.e., overlying the gate structure and semiconductor layer 202), and a drain contact layer 238 (e.g., a metal layer) may be formed on the back side of the substrate 201.

Figure 7:
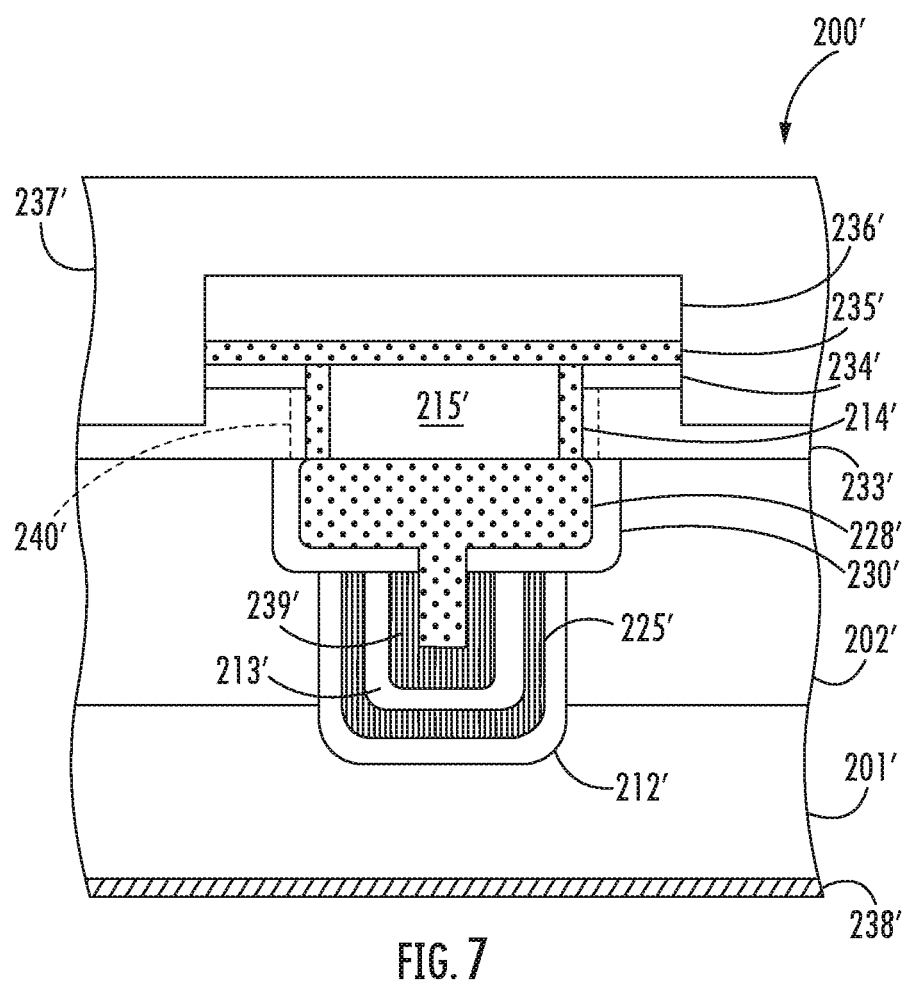
FIG. 7 is a schematic cross-sectional diagram of another IGFET including a hyper-abrupt junction incorporating a single superlattice in accordance with an example embodiment.

Turning now to FIG. 7, in accordance with another example embodiment of the IGFET 200' the hyper-abrupt junction region 208' illustratively includes a single superlattice layer 225'. More particularly, in this example the hyper-abrupt junction region 208' illustratively includes a first semiconductor layer 212' having a first conductivity type (N or P), the superlattice layer 225', a second semiconductor layer 213' having a second conductivity type 213' (P or N) opposite the first conductivity type, and an optional intrinsic semiconductor layer 239'. The remaining components of the IGFET 200' may be similar to those described above with respect to FIG. 6.

Figure 8:
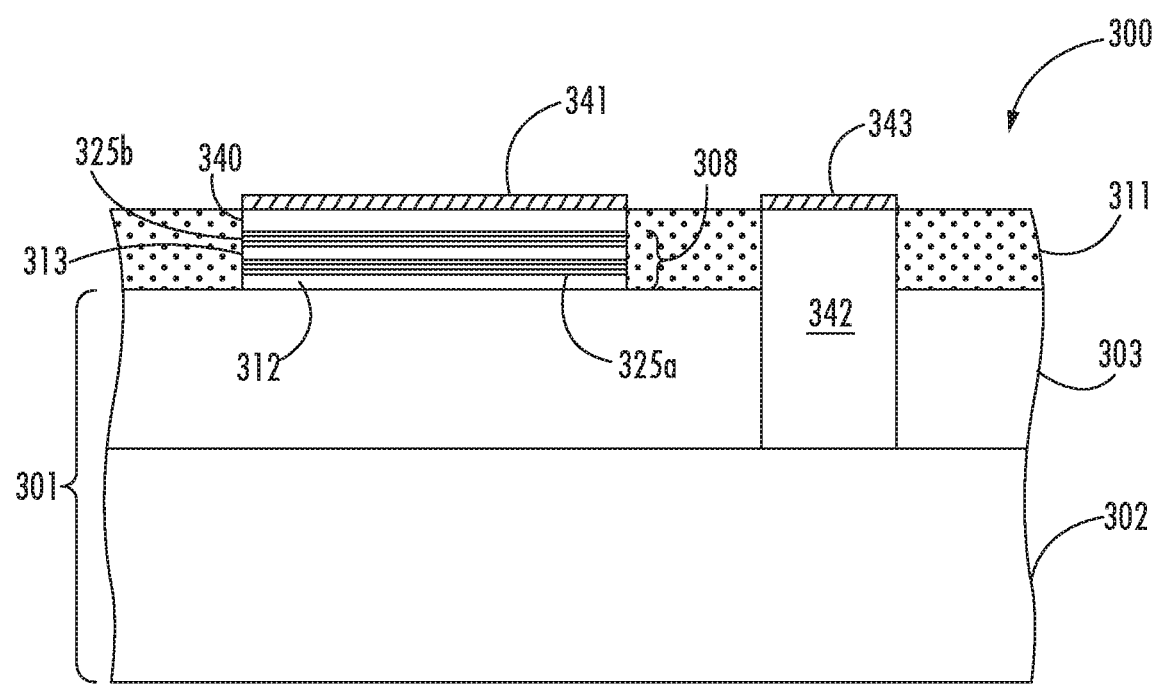
FIG. 8 is a schematic cross-sectional diagram of a varactor including a hyper-abrupt junction incorporating superlattices in accordance with an example embodiment.
Figure 11:
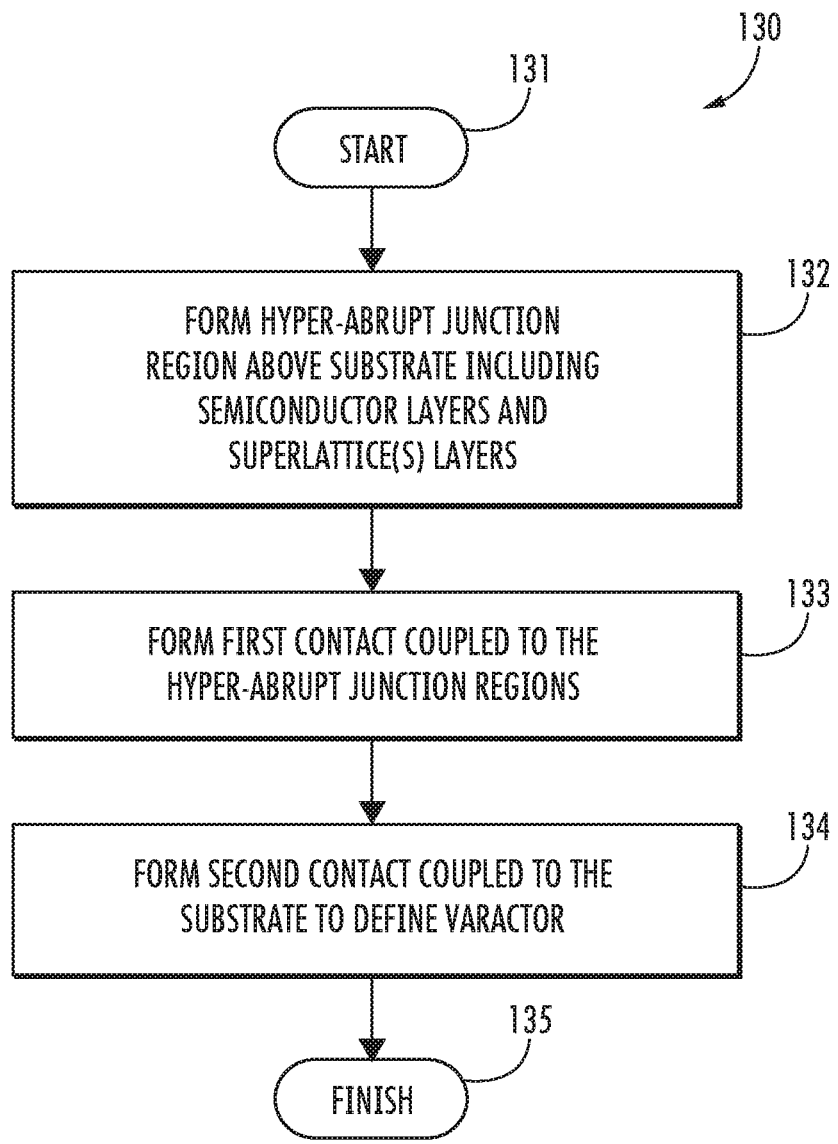
FIG. 11 is a flow diagram illustrating method aspects associated with fabrication of the devices of FIGS. 8-9.

Turning now to FIG. 8 and the flow diagram 130 of FIG. 11, a varactor 300 incorporating a hyper-abrupt junction layer 308 and associated method of fabrication are now described. The varactor 300 illustratively includes a substrate 301 having a cathode layer 302 and a collector layer 303 on the cathode layer. Beginning at Block 131, the hyper-abrupt junction region 308 may be grown on the collector layer 303 of the substrate 301 (Block 132). More particularly, the hyper-abrupt junction region 308 illustratively includes a first semiconductor layer 312 having a first conductivity type (P or N), a first superlattice 325a on the first semiconductor layer, a second semiconductor layer 313 on the first superlattice layer having a second conductivity type different than (i.e., opposite) the first conductivity type (N or P), and a second superlattice layer 325b on the second semiconductor layer.

Furthermore, an anode region 340 and associated metal layer 341 (i.e., a first contact) are formed on the hyper-abrupt junction region 308, at Block 133. Furthermore, a reach through implant 342 and associated metal layer 343 (i.e., a second contact) are also formed (Block 134) to contact the cathode layer 302 of the substrate 301 (it should be noted that this may instead be formed as a backside contact if desired in some embodiments). The reach through implant 342 is laterally spaced apart from the hyper-abrupt junction 308 and extends from a surface of the collector layer 303 to the cathode layer 302. More particularly, the reach through implant 342 may have an opposite conductivity type than the cathode layer 302 and collector layer 303, and the collector layer and first semiconductor layer 312 may have the same conductivity type. Furthermore, isolation regions 311 (e.g., a dielectric) may be formed around the hyper-abrupt junction region 308 and the reach through implant 342. The method of FIG. 11 concludes at Block 135.

Figure 9A:
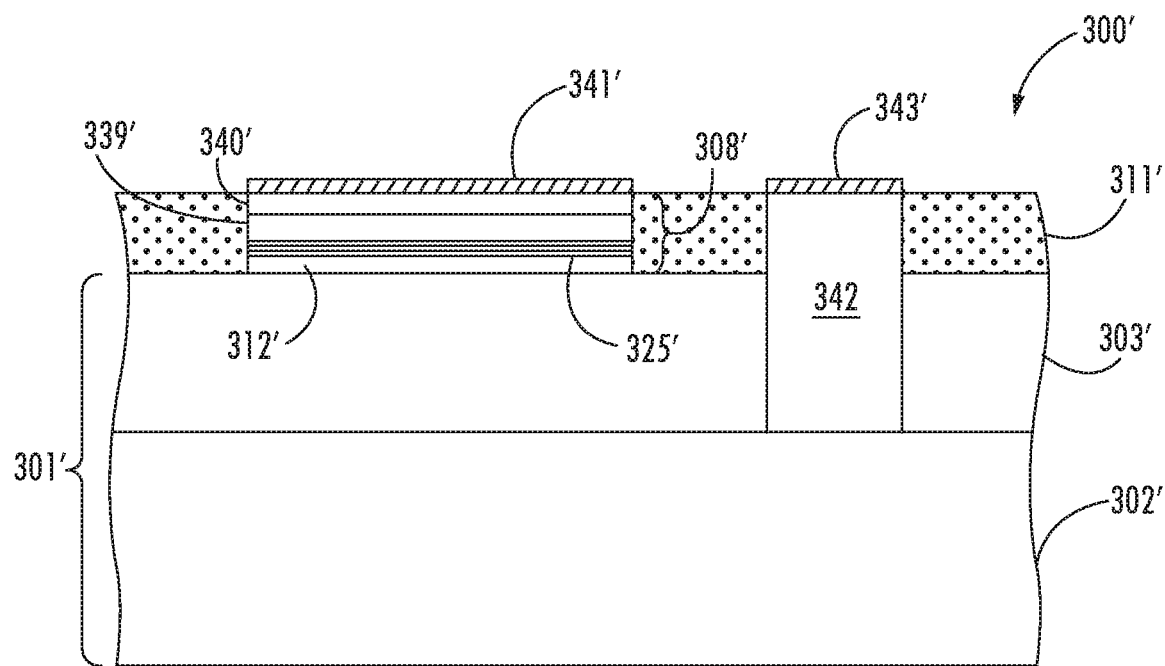
FIGS. 9A and 9B are schematic cross-sectional diagrams of other varactors including a hyper-abrupt junction incorporating a single superlattice in accordance with example embodiments.
Figure 9B:
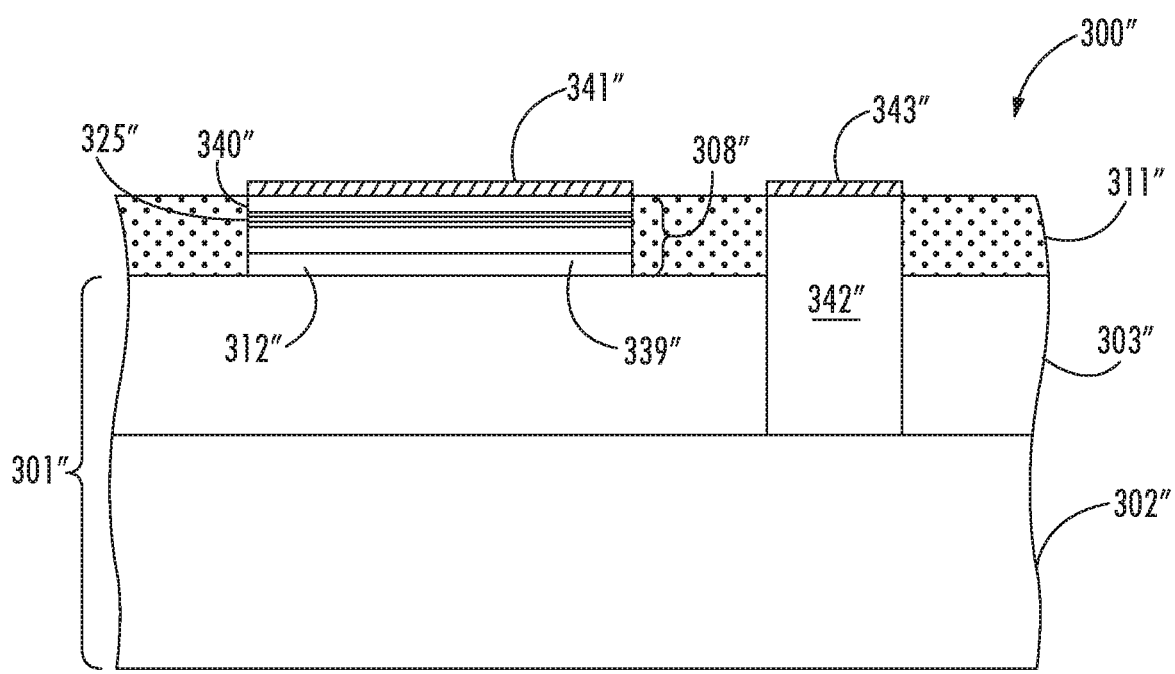

Another similar varactor 330' is now described with reference to FIG. 9A in which the hyper-abrupt junction 308' illustratively includes a single semiconductor layer 325'. More particularly, the hyper-abrupt junction 308' illustratively includes the first semiconductor layer 312', the superlattice 325', an intrinsic semiconductor layer 339', and a second semiconductor layer 340' (which also serves as the anode region). Still another similar varactor 330" is shown in FIG. 9B, in which all of the components are the same as in the varactor 330' except that the intrinsic layer 339" is below the superlattice layer 325" instead of above it. The remaining components of the varactors 330', 330" may be similar to those described above with respect to FIG. 8.

Further details regarding JFET, IGFET, and varactor structures may respectively be found in U.S. Pat. No. 7,825,441 to Eshun et al.; U.S. Pub. No. 2007/0278565 to Tu et al.; and U.S. Pat. No. 7,183,628 to Coolbaugh et al., which are hereby incorporated herein in their entireties by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:
    forming a hyper-abrupt junction region above a substrate and comprising
        a first semiconductor layer having a first conductivity type,
        a first superlattice layer on the first semiconductor layer,
        a second semiconductor layer on the first superlattice layer and having a second conductivity type different than the first conductivity type, and
        a second superlattice layer on the second semiconductor layer;
    forming a gate dielectric layer in direct contact with the second superlattice layer of the hyper-abrupt junction region;
    forming a gate electrode in direct contact with the gate dielectric layer; and
    forming spaced apart source and drain regions coupled to the hyper-abrupt junction region;
    the first and second superlattices each comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

2. The method of claim 1 wherein the spaced apart source and drain regions have the second conductivity type.

3. The method of claim 1 wherein the first and second semiconductor layers and the first and second superlattice layers are parallel to underlying portions of the substrate.

4. The method of claim 1 wherein the first and second semiconductor layers and the first and second superlattice layers are U-shaped.

5. The method of claim 1 wherein the first and second semiconductor layers each has a thickness in a range of 50 nm to 300 nm.

6. The method of claim 1 wherein the base semiconductor monolayers comprise silicon monolayers.

7. The method of claim 1 wherein the at least one non-semiconductor monolayer comprises oxygen.

8. The method of claim 1 wherein the base semiconductor monolayers comprise germanium.

9. The method of claim 1 wherein the at least one non-semiconductor monolayer comprises at least one of oxygen, nitrogen, fluorine, carbon and carbon-oxygen.

10. A method for making a semiconductor device comprising:
    forming a hyper-abrupt junction region above a substrate and comprising
        a first semiconductor layer having a first conductivity type,
        a first superlattice layer on the first semiconductor layer,
        a second semiconductor layer on the first superlattice layer and having a second conductivity type different than the first conductivity type, and
        a second superlattice layer on the second semiconductor layer,
        the first and second semiconductor layers and the first and second superlattice layers being parallel to underlying portions of the substrate;
    forming a gate dielectric layer in direct contact with the second superlattice layer of the hyper-abrupt junction region;
    forming a gate electrode in direct contact with the gate dielectric layer; and
    forming spaced apart source and drain regions coupled to the hyper-abrupt junction region having the second conductivity type;
    the first and second superlattices each comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

11. The method of claim 10 wherein the first and second semiconductor layers each has a thickness in a range of 50 nm to 300 nm.

12. The method of claim 10 wherein the base semiconductor monolayers comprise silicon monolayers.

13. The method of claim 10 wherein the at least one non-semiconductor monolayer comprises oxygen.

14. A method for making a semiconductor device comprising:
    forming a hyper-abrupt junction region above a substrate and comprising
        a first semiconductor layer having a first conductivity type,
        a first superlattice layer on the first semiconductor layer,
        a second semiconductor layer on the first superlattice layer and having a second conductivity type different than the first conductivity type, and
        a second superlattice layer on the second semiconductor layer,
        the first and second semiconductor layers and the first and second superlattice layers being U-shaped;
    forming a gate dielectric layer on the second superlattice layer of the hyper-abrupt junction region;
    forming a gate electrode on the gate dielectric layer; and
    forming spaced apart source and drain regions coupled to the hyper-abrupt junction region having the second conductivity type;
    the first and second superlattices each comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

15. The method of claim 14 wherein the first and second semiconductor layers each has a thickness in a range of 50 nm to 300 nm.

16. The method of claim 14 wherein the base semiconductor monolayers comprise silicon monolayers.

17. The method of claim 14 wherein the at least one non-semiconductor monolayer comprises oxygen.

18. A method for making a semiconductor device comprising:

forming a hyper-abrupt junction region above the substrate and comprising
- a first semiconductor layer having a first conductivity type,
- a first superlattice layer on the first semiconductor layer,
- a second semiconductor layer on the first superlattice layer and having a second conductivity type different than the first conductivity type, and
- a second superlattice layer on the second semiconductor layer;

forming a gate dielectric layer in direct contact with the second superlattice layer of the hyper-abrupt junction region;

forming a gate electrode in direct contact with the gate dielectric layer; and forming spaced apart source and drain regions coupled to the hyper-abrupt junction region;

the first and second superlattices each comprising a plurality of stacked groups of layers, each group of layers comprising a plurality of stacked base silicon monolayers defining a base silicon portion, and at least one oxygen monolayer constrained within a crystal lattice of adjacent base silicon portions.

19. The method of claim 18 wherein the spaced apart source and drain regions have the second conductivity type.

20. The method of claim 18 wherein the first and second semiconductor layers and the first and second superlattice layers are parallel to underlying portions of the substrate.

21. The method of claim 18 wherein the first and second semiconductor layers and the first and second superlattice layers are U-shaped.

22. The method of claim 18 wherein the first and second semiconductor layers each has a thickness in a range of 50 nm to 300 nm.

* * * * *